United States Patent
Toko et al.

(10) Patent No.: US 9,653,182 B1
(45) Date of Patent: May 16, 2017

(54) TESTING METHOD, MANUFACTURING METHOD, AND TESTING DEVICE OF MEMORY DEVICE

(71) Applicant: KABUSHIKI KAISHA TOSHIBA, Minato-ku, Tokyo (JP)

(72) Inventors: Masaru Toko, Seoul (KR); Keiji Hosotani, Seoul (KR); Hisanori Aikawa, Seoul (KR); Tatsuya Kishi, Seongnam-si (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/261,730

(22) Filed: Sep. 9, 2016

Related U.S. Application Data

(60) Provisional application No. 62/301,979, filed on Mar. 1, 2016.

(51) Int. Cl.
| | |
|---|---|
| *G11C 11/16* | (2006.01) |
| *G11C 29/12* | (2006.01) |
| *H01L 43/12* | (2006.01) |
| *H01L 43/08* | (2006.01) |
| *H01L 43/10* | (2006.01) |

(52) U.S. Cl.
CPC ............. *G11C 29/12* (2013.01); *G11C 11/16* (2013.01); *G11C 11/161* (2013.01); *G11C 11/1673* (2013.01); *H01L 43/08* (2013.01); *H01L 43/10* (2013.01); *H01L 43/12* (2013.01)

(58) Field of Classification Search
CPC .............................. G11C 11/16; G11C 13/0069
USPC .................................................. 365/158, 173
See application file for complete search history.

(56) References Cited

U.S. PATENT DOCUMENTS

| | | | | |
|---|---|---|---|---|
| 6,838,740 B2* | 1/2005 | Huai | ...................... | B82Y 25/00 257/295 |
| 6,972,992 B1* | 12/2005 | Fukuzumi | .............. | B82Y 25/00 257/E43.004 |
| 7,561,385 B2* | 7/2009 | Nakamura | .............. | H01L 43/08 360/324.12 |
| 7,786,725 B2* | 8/2010 | Furukawa | .............. | B82Y 25/00 324/207.21 |
| 8,159,866 B2* | 4/2012 | Apalkov | ................. | G11C 11/16 365/158 |

(Continued)

FOREIGN PATENT DOCUMENTS

| | | |
|---|---|---|
| JP | 2011187127 A | 9/2011 |
| JP | 2011187128 A | 9/2011 |

*Primary Examiner* — Michael Tran
(74) *Attorney, Agent, or Firm* — Holtz, Holtz & Volek PC

(57) ABSTRACT

According to one embodiment, a testing method of a memory device includes annealing the memory device, the memory device including a memory element; performing, after the annealing, to the memory element a process which sets a first magnetization orientation of a first ferromagnetic layer to be antiparallel to a second magnetization orientation of the second ferromagnetic layer; reading, after the performing of the process, data from the memory element; and determining the memory element as defective due to the second magnetization orientation being parallel to a third magnetization orientation of a third ferromagnetic layer, when data represented by the first magnetization orientation being antiparallel to the second magnetization orientation differs from the read data.

19 Claims, 11 Drawing Sheets

(56) References Cited

U.S. PATENT DOCUMENTS

| | | | | |
|---|---|---|---|---|
| 8,779,537 B2 * | 7/2014 | Huai | ................. | B82Y 25/00 |
| | | | | 257/295 |
| 8,848,433 B2 * | 9/2014 | Saida | ................. | G11C 11/161 |
| | | | | 365/158 |
| 9,373,781 B2 * | 6/2016 | Tang | ................. | H01L 43/12 |
| 2013/0301335 A1 | 11/2013 | Ong | | |

* cited by examiner

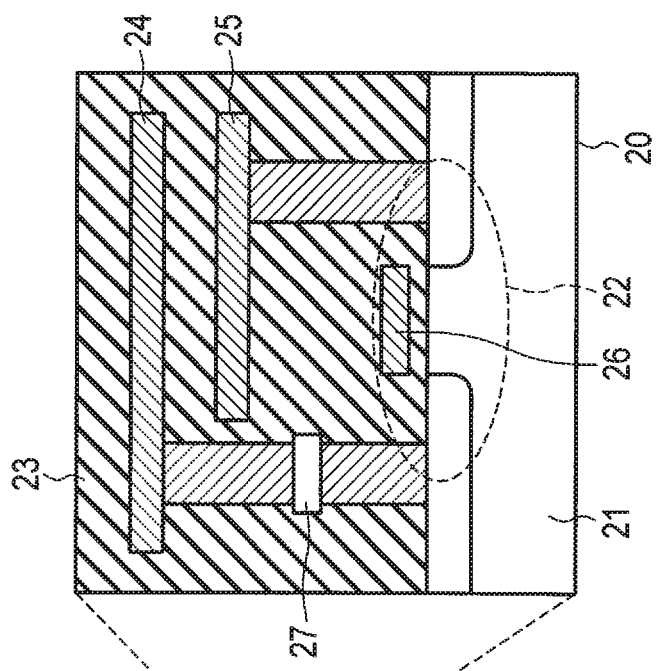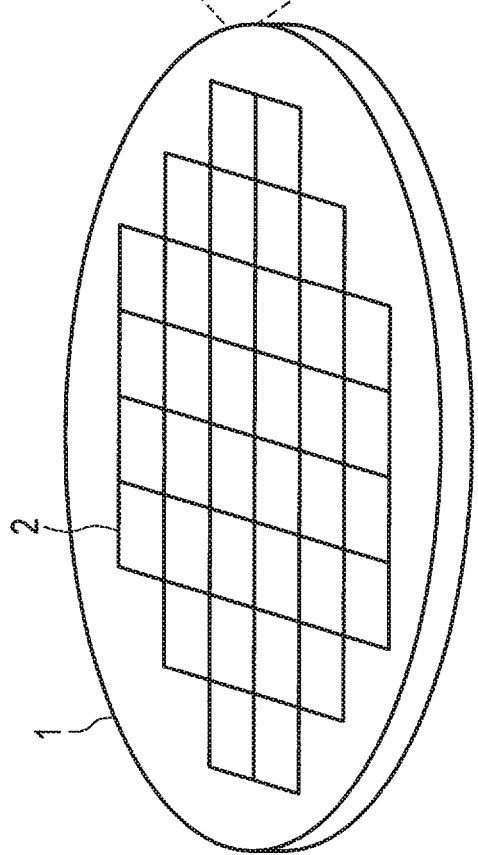
F I G. 1

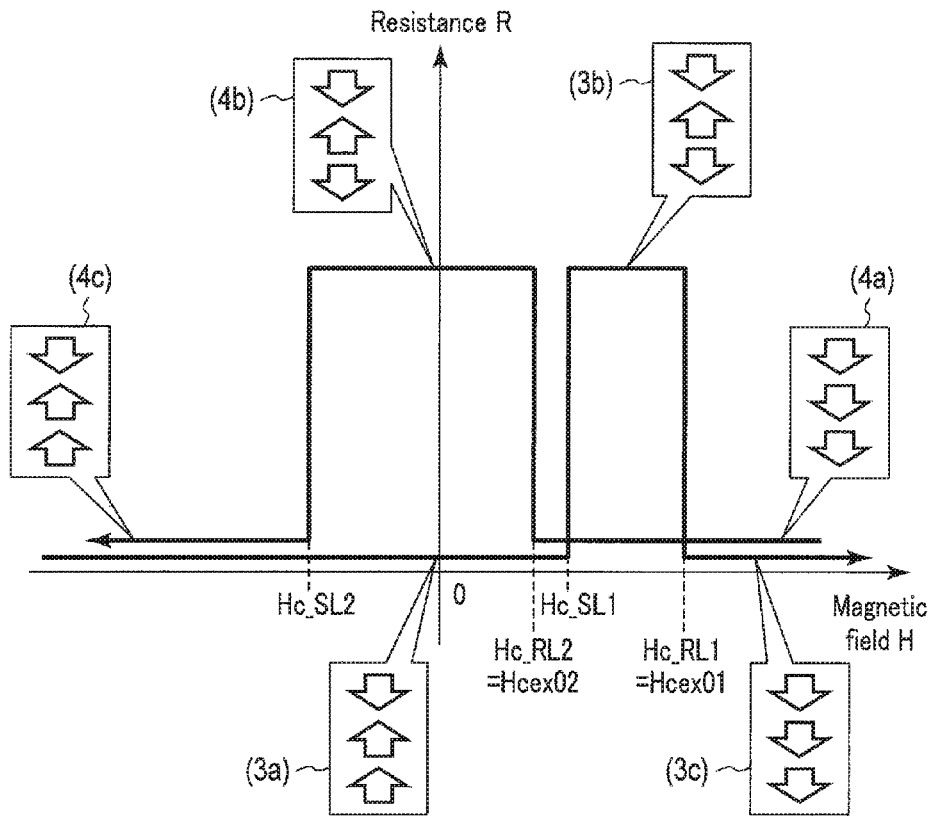
F I G. 12
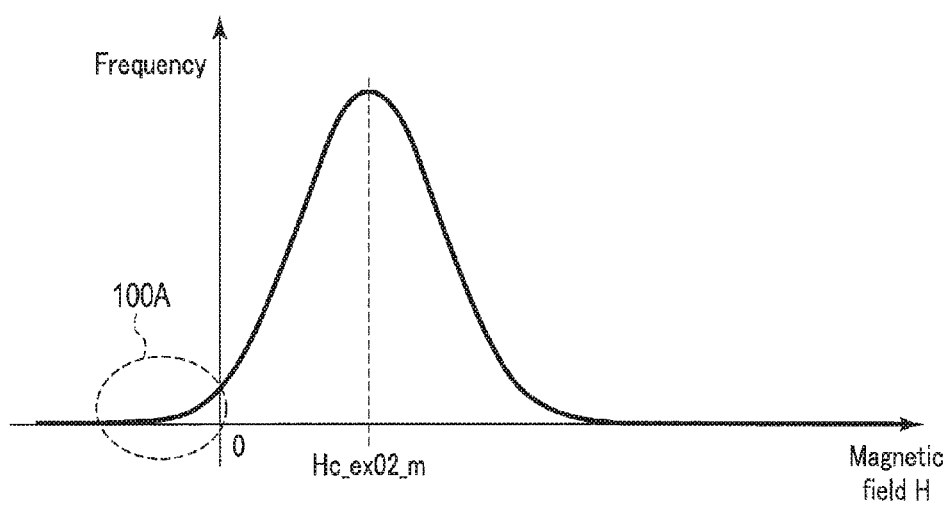
F I G. 13

| Hard fail mode | Magnetization orientation of "hard fail" MTJ | Initial magnetization orientation of MTJ |
|---|---|---|
| Negative Hc_ex02 | ⬇ ⬆<br>⬇ ⬆<br>⬇ or ⬆ | ⬇ ⬆ :SCL<br>⬆ ⬇ :RL<br>⬄ or ⬄ :SL |

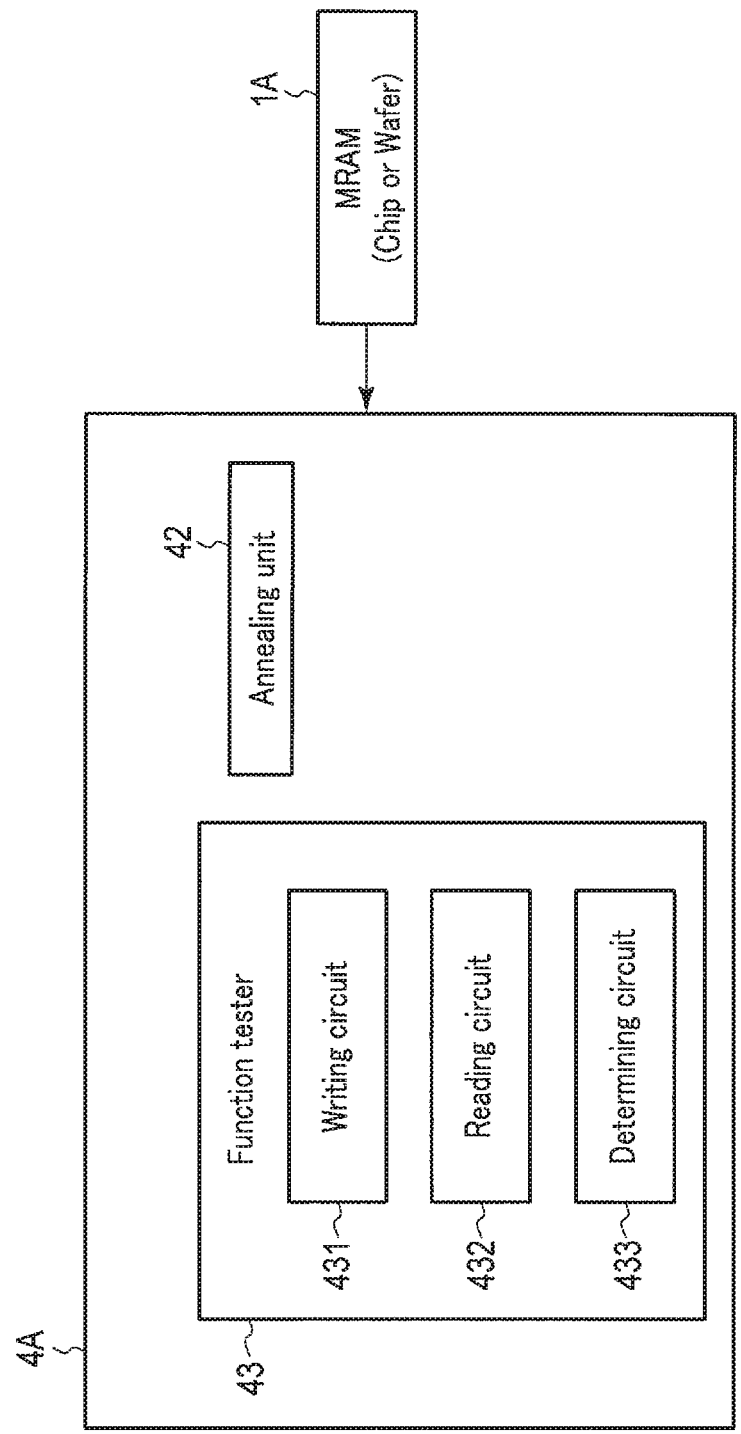
F I G. 16

TESTING METHOD, MANUFACTURING METHOD, AND TESTING DEVICE OF MEMORY DEVICE

CROSS-REFERENCE TO RELATED APPLICATIONS

This application claims the benefit of U.S. Provisional Application No. 62/301,979, filed Mar. 1, 2016, the entire contents of which are incorporated herein by reference.

FIELD

Embodiments described herein relate generally to a testing method, a manufacturing method, and a testing device of a memory device.

BACKGROUND

As a memory device included in a memory system, there is known a magnetic storage device (MRAM: Magnetoresistive Random Access Memory) which employs a magnetoresistive effect element as a memory element.

The magnetic storage device includes, for example, a magnetoresistive effect element as a memory element. The magnetoresistive effect element includes a storage layer, a reference layer and a shift cancelling layer, which have magnetization. The magnetoresistive effect element can store data, for example, by setting the magnetization orientation of the storage layer to be either parallel or antiparallel to the magnetization orientation of the reference layer.

BRIEF DESCRIPTION OF THE DRAWINGS

FIG. 1 is a schematic view illustrating an external appearance of a magnetic storage device in a state of a wafer according to a first embodiment.

FIG. 12 is a schematic view illustrating an R-H characteristic of the magnetoresistive effect element according to the second embodiment.

FIG. 13 is a histogram illustrating a distribution of second magnetization orientation reversing magnetic fields in a case where a plurality of magnetoresistive effect elements according to the second embodiment were manufactured.

FIG. 16 is a block diagram illustrating the configuration of a testing device according to the second embodiment.

DETAILED DESCRIPTION

Figure 2:
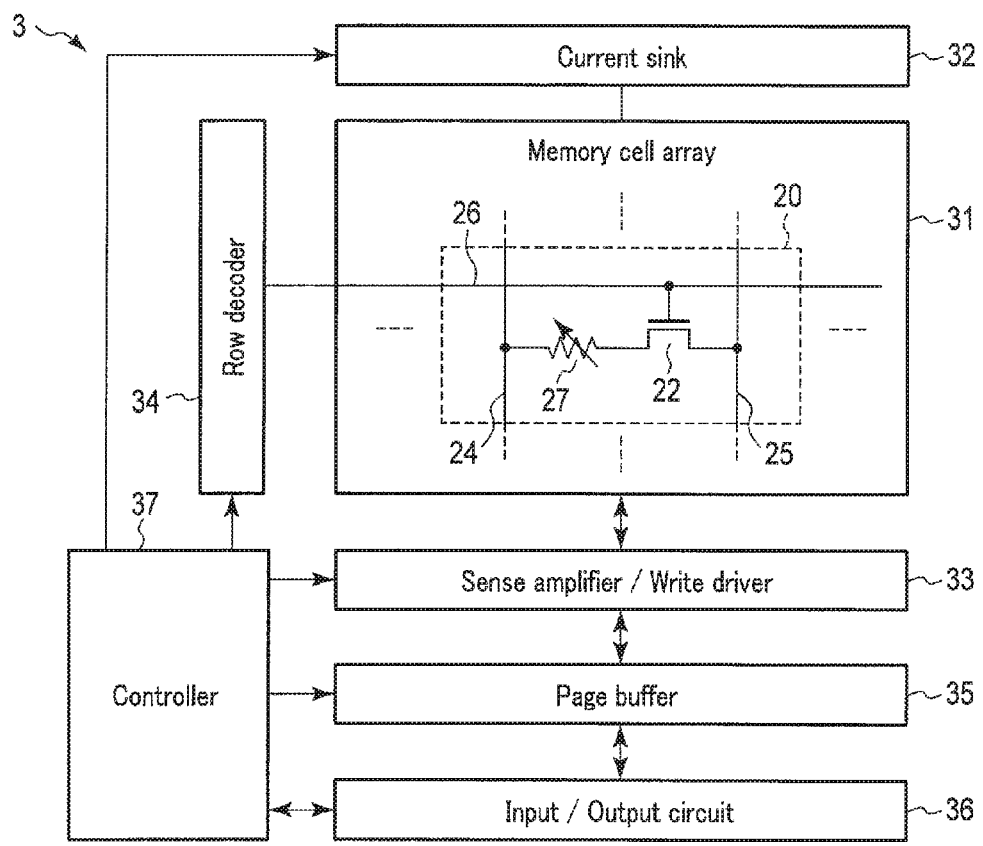
FIG. 2 is a block diagram illustrating the configuration of a storage device in a chip according to the first embodiment.

In general, according to one embodiment, testing method of a memory device, the memory device including a memory element, the memory element including a first ferromagnetic layer, a second ferromagnetic layer, a third ferromagnetic layer, a first nonmagnetic layer, and a second nonmagnetic layer, the first nonmagnetic layer being disposed between the first ferromagnetic layer and the second ferromagnetic layer, and the second nonmagnetic layer being disposed between the second ferromagnetic layer and the third ferromagnetic layer; performing, after the annealing, to the memory element a process which sets a first magnetization orientation of the first ferromagnetic layer to be antiparallel to a second magnetization orientation of the second ferromagnetic layer; reading, after the performing of the process which sets the first magnetization orientation to be antiparallel to the second magnetization orientation, data from the memory element; and determining the memory element as defective due to the second magnetization orientation to be parallel to a third magnetization orientation of the third ferromagnetic layer, when data represented by the first magnetization orientation being antiparallel to the second magnetization orientation differs from the read data.

Hereinafter, embodiments will be described with reference to the accompanying drawings. In the description below, structural elements having substantially the same functions and structures are denoted by like reference signs, and an overlapping description is given only where necessary. In addition, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

Respective functional blocks can be realized by hardware, or computer software, or the combination thereof. Thus, the respective blocks will be described mainly from the viewpoint of their functions, so as to make it clear that each functional block is hardware, or computer software, or the combination thereof. Whether such functions are executed as hardware or executed as software depends on design restrictions imposed on concrete embodiments or the entire system. A skilled person may realize these functions by various methods with respect to each of concrete embodiments, and to decide on such realization falls within the scope of the present invention.

1. First Embodiment

A description will be given of testing method, manufacturing method, and a testing device of a memory device according to a first embodiment.

1.1. Re: Configuration

1.1.1. Re: Configuration of Magnetic Storage Device

To begin with, the configuration of the storage device according to the first embodiment is described. The storage device according to the first embodiment is, for example, a spin transfer torque-type magnetic storage device (STT-MRAM: Spin Transfer Torque-Magnetoresistive Random Access Memory) by a vertical magnetization method, which employs a magnetoresistive effect element (MTJ (Magnetic Tunnel Junction) element) as a memory element.

FIG. 1 is a schematic view of the storage device according to the first embodiment, and illustrates an external appearance of a wafer, and a cross section of a memory cell which is a part of the storage device provided on the wafer. Incidentally, a plurality of semiconductor integrated circuit chips (hereinafter referred to simply as "chips"), which are included in one wafer, are also referred to as "chips" even in a state before they are cut out of the wafer.

As illustrated in the Figure, the wafer 1 includes a plurality of chips 2. In each chip 2, a magnetic storage device 3 is provided, and the magnetic storage device 3 includes a plurality of memory cells 20. In each memory cell 20 in each chip 2, a cell transistor 22 is formed on a semiconductor substrate 21. An interlayer insulation film 23 is formed on the semiconductor substrate 21 in a manner to cover the cell transistor 22. Further, a bit line 24, a source line 25, a word line 26 and a magnetoresistive effect element 27 are formed in the interlayer insulation film 23. A passivation film (not shown) may be disposed on the interlayer insulation film 23. The passivation film has a function to protect the magnetic storage device 3. In addition, each memory cell 20 may include an external terminal (not shown) which is accessible from a screening device (to be described later) even when each memory cell 20 is in the state of the wafer 1.

FIG. 2 is a block diagram illustrating the configuration of the magnetic storage device 3 provided in the chip 2. The magnetic storage device 3 includes a memory cell array 31, a current sink 32, a sense amplifier and write driver (SA/WD) 33, a row decoder 34, a page buffer 35, an input/output circuit 36, and a controller 37.

As illustrated in the Figure, the memory cell array 31 includes a plurality of memory cells 20 which are associated with rows and columns. In addition, the memory cells on an identical row are connected to an identical word line 26, and the memory cells on an identical column are connected to an identical pair of bit line 24 and source line 25.

The memory cell 20 includes a cell transistor 22 and a magnetoresistive effect element 27. The cell transistor 22 is connected in series to the magnetoresistive effect element 27, and functions as a switch which controls the supply and stop of an electric current to the magnetoresistive effect element 27. If the cell transistor 22 is turned on, the supply of current is started. If the cell transistor 22 is turned off, the supply of current is stopped. By the current controlled by the cell transistor 22, the resistance value of the magnetoresistive effect element 27 can be switched between a low resistance state and a high resistance state. The magnetoresistive effect element 27 functions as a memory element to which data can be written by a change of the resistance state of the magnetoresistive effect element 27, and the written data can be stored in and read from the memory element.

At one end of the magnetoresistive effect element 27, the memory cell 20 is connected to one of the paired bit line 24 and source line 25, for example, the bit line 24. At one end of the current path of the cell transistor 22, the memory cell 20 is connected to the other of the paired bit line 24 and source line 25, for example, the source line 25. In addition, the memory cell 20 is connected to the word line 26 at the gate of the cell transistor 22.

The current sink 32 is connected to the bit line 24 and source line 25. The current sink 32 sets the bit line 24 or source line 25 at a ground potential in operations such as data write and read.

The SA/WD 33 is connected to the bit line 24 and source line 25. The SA/WD 33 supplies an electric current to the memory cell 20 of an operation target via the bit line 24 and source line 25, and executes data write and read to/from the memory cell 20. To be more specific, the write driver of the SA/WD 33 executes data write to the memory cell 20, and the sense amplifier of the SA/WD 33 executes data read from the memory cell 20.

The row decoder 34 is connected to the memory cell array 31 via a plurality of word lines 26. The row decoder 34 decodes a row address which designates the row direction of the memory cell array 31. In addition, the row decoder 34 selects the word line 26 in accordance with the decoded result, and applies a voltage which is necessary for operations such as data write and read.

The page buffer 35 temporarily stores, in units of data called "page", data which is to be written in the memory cell array 31, and data which was read from the memory cell array 31.

The input/output circuit 36 transmits various signals, which were received from the outside, to the controller 37 and page buffer 35, and transmits various pieces of information from the controller 37 and page buffer 35 to the outside.

The controller 37 is connected to the current sink 32, SA/WD 33, row decoder 34, page buffer 35, and input/output circuit 36. The controller 37 controls the current sink 32, SA/WD 33, row decoder 34 and page buffer 35 in accordance with various signals which the input/output circuit 36 received from the outside.

1.1.2. Re: Configuration of Magnetoresistive Effect Element

Figure 3:
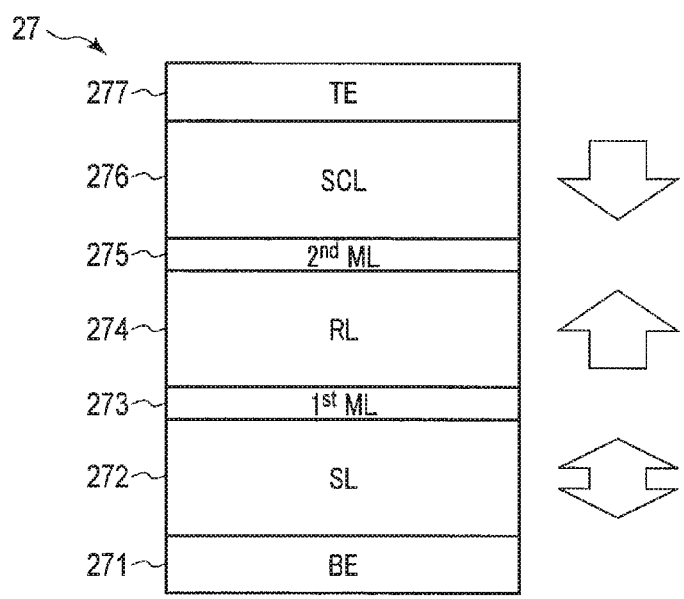
FIG. 3 is a schematic view illustrating the configuration of a magnetoresistive effect element which the storage device according to the first embodiment includes.

Next, the configuration of the magnetoresistive effect element according to the first embodiment is described with reference to FIG. 3. FIG. 3 is a schematic view illustrating a configuration example of the magnetoresistive effect element 27 which the magnetic storage device 3 according to the first embodiment includes. The magnetoresistive effect element 27 functions as a memory element which can store data by taking different resistance states in accordance with the direction of an electric current flowing through the magnetoresistive effect element 27. A phenomenon, in which different resistances are exhibited in accordance with states, is called a magnetoresistive effect.

As illustrated in the Figure, the magnetoresistive effect element 27 includes a storage layer (SL) 272 functioning as a first ferromagnetic layer provided on a bottom electrode (BE) 271; a reference layer (RL) 274 functioning as a second ferromagnetic layer provided above the storage layer 272; and a shift cancelling layer (SCL) 276 functioning as a third ferromagnetic layer provided above the reference layer 274. A top electrode (TE) 277 is provided on the shift cancelling layer 276. In addition, the magnetoresistive effect element 27 includes a first middle layer (1st ML: $1^{st}$ Middle Layer) 273 functioning as a first nonmagnetic layer between the storage layer 272 and reference layer 274, and a second middle layer (2nd ML: $2^{nd}$ Middle Layer) 275 functioning as a second nonmagnetic layer between the reference layer 274 and shift cancelling layer 276. The storage layer 272, first middle layer 273 and reference layer 274 constitute a magnetic tunnel junction (MTJ).

The storage layer 272 and reference layer 274 are ferromagnetic layers having magnetic anisotropy in a direction perpendicular to the film surface, that is, in a direction of arrows in FIG. 3. The magnetization easy axis directions of the storage layer 272 and reference layer 274 are perpendicular to the films. Accordingly, the magnetoresistive effect element 27 is a perpendicular magnetization-type MTJ element in which the magnetization orientation of each of the storage layer 272 and reference layer 274 is perpendicular to the film surface.

The storage layer 272 has a magnetization orientation toward either the bottom electrode 271 side or the reference layer 274 side. The magnetization orientation of the storage layer 272 is more easily reversed than that of the reference layer 274. The reference layer 274 is designed to have a material composition and a film thickness so as to have a sufficiently greater perpendicular magnetic anisotropy energy than the storage layer 272. Thereby, the magnetization orientation of the reference layer 274 is less easily reversed than the storage layer 272 due to an external environment. For example, the reference layer 274 has a greater coercivity than the storage layer 272. The coercivity is a retention characteristic of magnetism. As the coercivity is greater, magnetism is retained more easily, and the magnetization orientation is reversed less easily. An electric current, which is caused to flow through the magnetoresistive effect element 27 in order to reverse the magnetization orientation, is called a magnetization reversal current. Then, the magnetization reversal current of the reference layer 274 becomes higher than the magnetization reversal current of the storage layer 272. In addition, for example, the magnetization orientation of the reference layer 274 is less easily reversed due to a temperature variation than the magnetization orientation of the storage layer 272.

The shift cancelling layer 276 is a ferromagnetic layer having magnetic anisotropy in a direction perpendicular to the film surface. Since the shift cancelling layer 276 is designed to have a sufficiently greater perpendicular magnetic anisotropy energy than the reference layer 274 and storage layer 272, reversal in magnetization orientation does not easily occur due to an external environment. Specifically, the shift cancelling layer 276 has a greater coercivity than the reference layer 274 and storage layer 272. The shift cancelling layer 276 is magnetically initialized in an antiparallel direction to the magnetization orientation of the reference layer 274.

The storage layer 272, reference layer 274 and shift cancelling layer 276 generate leak magnetic fields to the outside. Since the coercivity of the storage layer 272 is less than that of the reference layer 274, the storage layer 272 is greatly affected by the leak magnetic field from the reference layer 274. To be more specific, by the influence of the leak magnetic field from the reference layer 274, the coercivity of the storage layer 272 shifts such that the magnetization orientations of the reference layer 274 and storage layer 272 are stabilized in the parallel state, thus causing an increase in magnetization reversal current or a decrease in thermal stability. In addition, the leak magnetic field of the reference layer 274 is affected by the leak magnetic field from the shift cancelling layer 276. To be more specific, for example, when the magnetization orientation of the shift cancelling layer 276 is parallel to the magnetization orientation of the reference layer 274, the leak magnetic field of the reference layer 274 is intensified by the leak magnetic field from the shift cancelling layer 276. In addition, for example, when the magnetization orientation of the shift cancelling layer 276 is antiparallel to the magnetization orientation of the reference layer 274, the leak magnetic field of the reference layer 274 is weakened by the leak magnetic field from the shift cancelling layer 276. In this manner, when the magnetization orientation of the shift cancelling layer 276 is antiparallel to the magnetization orientation of the reference layer 274, it is possible to suppress the influence exerted on the storage layer 272 by the leak magnetic field from the reference layer 274.

In the meantime, it should suffice if the magnetization orientations of the reference layer 274 and shift cancelling layer 276 are antiparallel to each other, and the magnetization orientations are not limited to those illustrated in FIG. 3. For example, the magnetization orientation of the reference layer 274 may be a direction toward the storage layer 272, and the magnetization orientation of the shift cancelling layer 276 may be a direction toward the top electrode 277 side. However, it is assumed that the magnetoresistive effect element 27 according to the present embodiment is magnetically initialized in the state of the wafer 1. Thus, in the magnetoresistive effect elements 27 on the same wafer 1, the magnetization orientations of the reference layers 274 are all identical, and the magnetization orientations of the shift cancelling layers 276 are all identical. The description below will be given on the assumption that the respective layers are magnetically initialized in the directions shown in FIG. 3.

The first middle layer 273 is a nonmagnetic layer for which a nonmagnetic metal, a nonmagnetic semiconductor, or an insulator can be used. When an insulator is used for the first middle layer 273, the first middle layer 273 is called a tunnel barrier layer, and magnesium oxide (MgO), for instance, is used.

The second middle layer 275 is a nonmagnetic layer which is provided in order to prevent the reference layer 274 and shift cancelling layer 276 from being ferromagnetically coupled. The second middle layer 275 has heat resistance for preventing the molecules of the reference layer 274 and shift cancelling layer 276 from mixing due to heat treatment, and also has a function of controlling crystalline orientation at a time when the shift cancelling layer 276 is formed. As the second middle layer 275, a nonmagnetic metal, such as ruthenium (Ru), platinum (Pt), silver (Ag) or copper (Cu), can be used.

In the meantime, in the present embodiment, a spin-transfer writing method is adopted in which a write current is caused to directly flow through the magnetoresistive effect element 27 and the magnetization orientation of the storage layer 272 is controlled by this write current. The magnetoresistive effect element 27 can take either a low resistance state or a high resistance state, depending on whether the relative relationship between the magnetization orientations of the storage layer 272 and reference layer 274 is parallel or antiparallel.

If a write current in a direction from the storage layer 272 toward the reference layer 274 is caused to flow through the magnetoresistive effect element 27, the relative relationship between the magnetization orientations of the storage layer 272 and reference layer 274 becomes parallel. In the case of this parallel state, the resistance value of the magnetoresistive effect element 27 is lowest, and the magnetoresistive effect element 27 is set in the low resistance state. This low resistance state is defined as data "0", for example.

If a write current in a direction from the reference layer 274 toward the storage layer 272 is caused to flow through the magnetoresistive effect element 27, the relative relationship between the magnetization orientations of the storage layer 272 and reference layer 274 becomes antiparallel. In the case of this antiparallel state, the resistance value of the magnetoresistive effect element 27 is highest, and the magnetoresistive effect element 27 is set in the high resistance state. This high resistance state is defined as data "1", for example.

Figure 4:
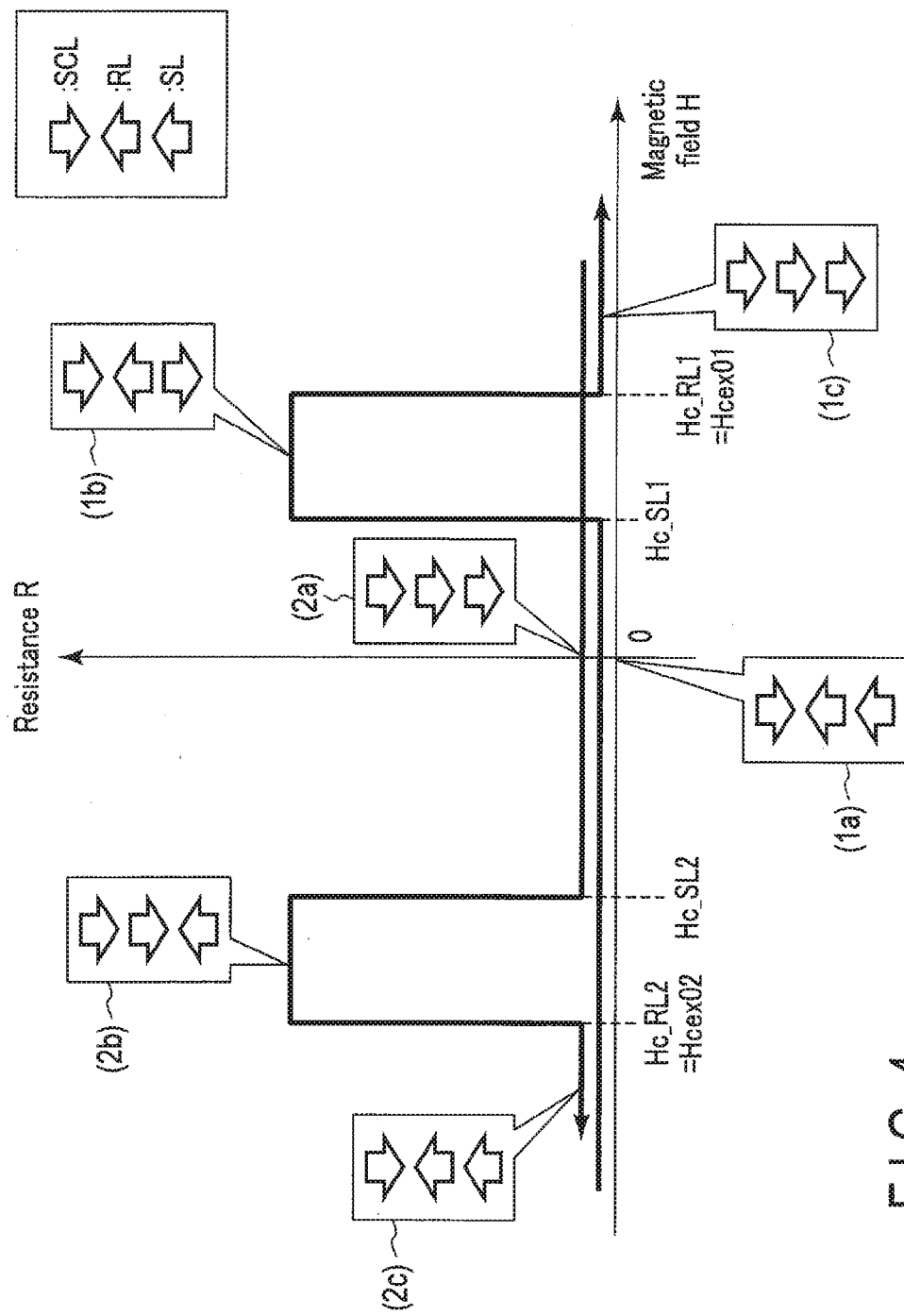
FIG. 4 is a schematic view illustrating an R-H characteristic of the magnetoresistive effect element according to the first embodiment.

FIG. 4 is a schematic view illustrating an R-H characteristic of the magnetoresistive effect element 27 according to the first embodiment. The R-H characteristic is the characteristic of the magnetoresistive effect element, which indicates a state in which the resistance value varies in accordance with the magnitude of a magnetic field that is applied. In the meantime, in the R-H characteristic shown in FIG. 4, it is assumed that the coercivity Hc_SCL (not shown) of the shift cancelling layer 276 is greater than the coercivity Hc_RL of the reference layer 274. In addition, in FIG. 4, a magnetic field of a magnitude exceeding the coercivity Hc_SCL is not depicted. Accordingly, in the range of the magnetic field illustrated in FIG. 4, it is assumed that the magnetization orientation of the shift cancelling layer 276 is fixed to be a direction of an arrow toward the reference layer 274.

As illustrated in the Figure, in an initial state (1a) in which the magnetic field is zero, the magnetization orientations of the reference layer 274 and shift cancelling layer 276 are antiparallel, and the magnetization orientations of the reference layer 274 and storage layer 272 are parallel. In the initial state (1a), the magnetoresistive effect element 27 is in the low resistance state. If a magnetic field in a direction from the shift cancelling layer 276 toward the storage layer 272 is applied from this state, the magnetization orientation of the storage layer 272 is reversed at a magnetic field Hc_SL1, and the magnetoresistive effect element 27 enters a high resistance state (1b). If the applied magnetic field is further increased, the magnetization orientation of the reference layer 274 is reversed at a magnetic field Hc_RL1, and the magnetoresistive effect element 27 enters a low resistance state (1c). In the state (1c), the magnetization orientations of the reference layer 274 and shift cancelling layer 276 become parallel. Accordingly, the shift cancelling layer 276 acts in such a direction as to intensify the leak magnetic field from the reference layer 274. By being affected by the intensified leak magnetic field from the reference layer 274, the storage layer 272 shifts such that the parallel state to the magnetization orientation of the reference layer 274 is stabilized. Specifically, the magnetization orientation of the storage layer 272 in the state (1c) is stabilized in the parallel state to the magnetization orientation of the reference layer 274, and is fixed.

If the applied magnetic field is weakened from this state (1c), the magnetization orientations of the reference layer 274 and storage layer 272 remain reversed from the initial state (1a) at a state (2a) in which the magnetic field is zero. If a magnetic field in an opposite direction is further applied, the magnetization orientation of the storage layer 272 is reversed at a magnetic field Hc_SL2, and the magnetoresistive effect element 27 enters a high resistance state (2b). If the magnetic field is further applied, the magnetization orientation of the reference layer 274 is reversed at a magnetic field Hc_RL2, and the magnetoresistive effect element 27 enters a low resistance state (2c). At this time, the magnetization orientations of the reference layer 274 and shift cancelling layer 276 become antiparallel. Accordingly, the shift cancelling layer 276 acts in such a direction as to weaken the leak magnetic field from the reference layer 274, and the magnetoresistive effect element 27 returns to the initial state (1a).

Here, a first magnetization orientation reversing magnetic field Hc_ex01 is defined as a magnetic field at a time when the magnetization orientations of the reference layer 274 and shift cancelling layer 276 change from the antiparallel state to the parallel state. In addition, a second magnetization orientation reversing magnetic field Hc_ex02 is defined as a magnetic field at a time when the magnetization orientations of the reference layer 274 and shift cancelling layer 276 change from the parallel state to the antiparallel state. In short, in the example of FIG. 4, Hc_ex01=Hc_RL1, and Hc_ex02=Hc_RL2.

In this manner, the magnetoresistive effect element 27 according to the present embodiment has such a characteristic that when the initial state (1a) was transitioned to the state (1c) and then transitioned back to the state (2a), all magnetization orientations of the storage layer 272, reference layer 274 and shift cancelling layer 276 become parallel. As described above, this state (2a) is a state in which the magnetization orientation of the storage layer 272 is fixed. Even if the magnetic field is restored to zero, the magnetoresistive effect element 27, which once transitioned to the state (2a), does not restore to the initial state (1a). Accordingly, unless the magnetization orientation of the reference layer 274 and the magnetization orientation of the shift cancelling layer 276 are restored to the antiparallel state, data "1" is not written to the magnetoresistive effect element 27 even if a normal magnetization reversal current is caused to flow. This state of the magnetoresistive effect element 27 is called "Hard fail".

In the meantime, hard fail is a general term meaning a state in which normal data write or correction is impossible, which is caused by the magnetoresistive effect element 27. Aside from the above case in which the magnetization orientation of the storage layer 272 is fixed, for example, dielectric breakdown is classified as hard fail. Hard fail is distinguished from "Soft fail" which is a bad state of data that can be corrected by rewrite of data. For example, a bad state, such as a data write error or data loss (retention), is classed as soft fail. In the description below, the state in which all magnetization orientations of the storage layer 272, reference layer 274 and shift cancelling layer 276 are parallel is called simply as "hard fail".

Figures 5, 6:
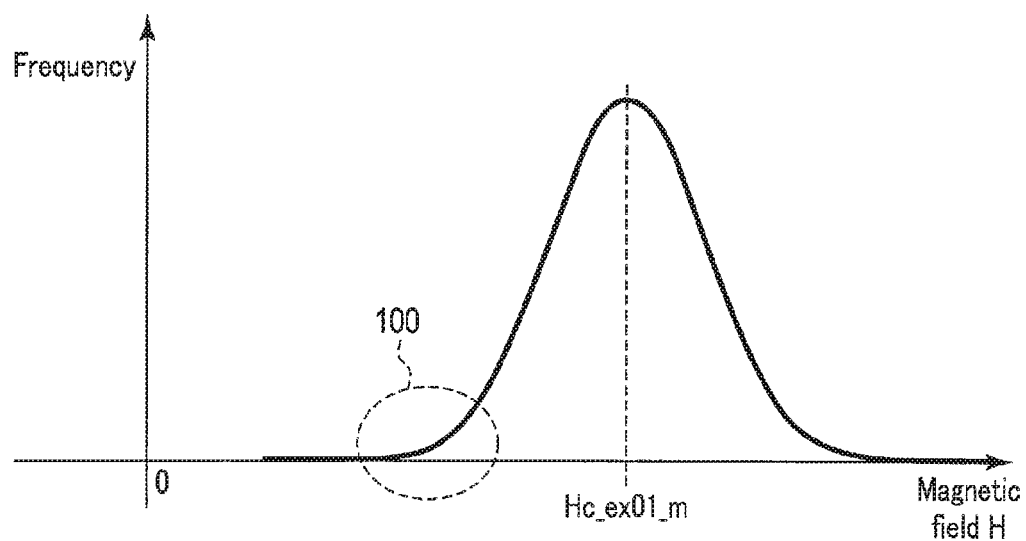
FIG. 5 is a diagram illustrating a mode in which the magnetoresistive effect element according to the first embodiment causes hard fail.
FIG. 6 is a histogram illustrating a distribution of first magnetization orientation reversing magnetic fields in a case where a plurality of magnetoresistive effect elements according to the first embodiment were manufactured.

FIG. 5 is a diagram illustrating a mode in which the magnetoresistive effect element 27 according to the first embodiment causes hard fail. As illustrated in the Figure, when the first magnetization orientation reversing magnetic field Hc_ex01 has a low value, the magnetoresistive effect element 27 may cause hard fail. The magnetization orientation of the magnetoresistive effect element 27, which is in hard fail, includes two magnetization orientations. In one of the two magnetization orientations, since the coercivity Hc_RL1 of the reference layer 274 is low, the magnetization orientation of the reference layer 274 is reversed from the magnetization orientation in the initial state. In the other magnetization orientation, since the coercivity Hc_SCL1 of the shift cancelling layer 276 is low, the magnetization orientation of the shift cancelling layer 276 is reversed from the magnetization orientation in the initial state. In each case, in the state of hard fail, all magnetization orientations of the storage layer 272, reference layer 274 and shift cancelling layer 276 become parallel.

FIG. 6 is a histogram illustrating a distribution of first magnetization orientation reversing magnetic fields Hc_ex01l in a case where a plurality of magnetoresistive effect elements 27 according to the first embodiment were manufactured. As illustrated in the Figure, when the magnetoresistive effect elements 27 according to the first embodiment were manufactured, the values of the first magnetization orientation reversing magnetic field Hc_ex01 vary among the individuals, and these values are distributed in a range centering on a design value Hc_ex01_m. Hard fail is caused when the Hc_ex01 has a low value. Accordingly, magnetoresistive effect elements 27, in which hard fail tends to easily occur, are distributed in a left-end region 100 of the histogram shown in FIG. 6.

Hard fail may also occur due to a variation in external environment, other than the applied magnetic field. For example, a temperature variation, in particular, a high-temperature environment, may reverse the magnetization orientation of the magnetoresistive effect element 27. Each of the ease in magnetization orientation reversal due to the variation in magnetic field and the ease in magnetization orientation reversal due to the variation in temperature depends on the magnitude of magnetic anisotropy energy, which is set in the magnetoresistive effect element 27. Accordingly, the magnetoresistive effect element 27, which may cause hard fail due to the variation in magnetic field, may similarly cause hard fail due to the variation in temperature. In other words, when the first magnetization orientation reversing magnetic field Hc_ex01 has a low value, the magnetoresistive effect element 27 according to the first embodiment similarly tends to cause hard fail due to the variation in temperature.

1.1.3. Re: Configuration of Testing Device

Next, the configuration of the entirety of a testing device of the magnetic storage device according to the first embodiment is described. The testing device according to the first embodiment is a device for screening beforehand bad memory cells in which hard fail would occur due to a variation in temperature in an IR reflow (Infrared reflow) soldering step when the magnetic storage device is manufactured.

Figure 7:
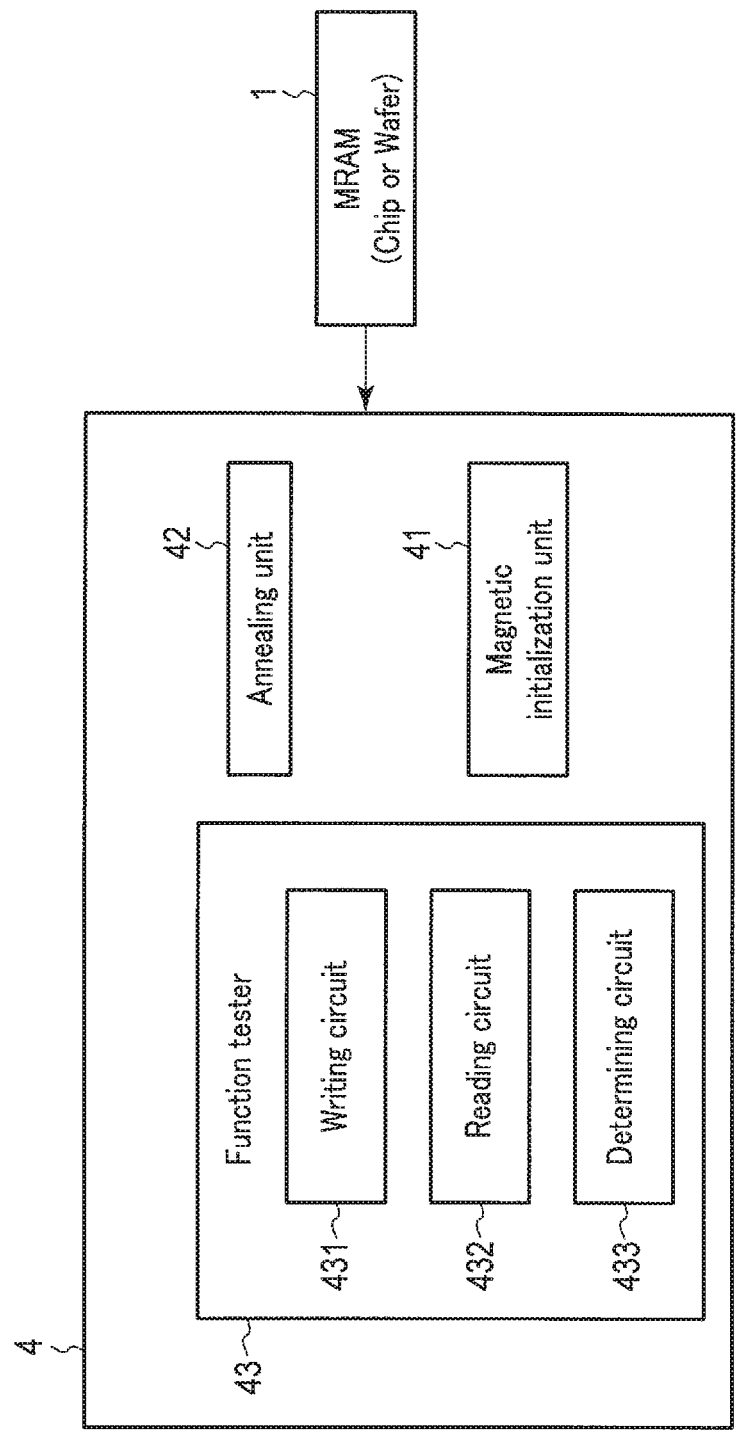
FIG. 7 is a block diagram illustrating the configuration of a testing device according to the first embodiment.

FIG. 7 is a block diagram illustrating the configuration of the testing device according to the first embodiment. As illustrated in the Figure, a screening device 4 includes a magnetic initialization unit 41, a heat treatment unit (annealing unit) 42, and a function tester 43. The testing device 4 can execute screening on the magnetic storage device 3 formed on the wafer 1.

The magnetic initialization unit 41 applies a magnetic field to the wafer 1 in a predetermined direction, and sets desired magnetization orientations for plural magnetoresistive effect elements 27 in the wafer 1. In order to set desired magnetization orientations for the storage layer 272, reference layer 274 and shift cancelling layer 276 in the magnetoresistive effect element 27, the magnetic initialization unit 41 can properly apply different magnetic fields in different directions. For example, the magnetic initialization unit 41 can execute magnetic initialization such that the magnetization orientation of the reference layer 274 and the magnetization orientation of the shift cancelling layer 276 become antiparallel. In the meantime, by the application of the magnetic field by the magnetic initialization unit 41, all magnetoresistive effect elements 27 in the wafer 1 are magnetically initialized with the same orientation. For example, the magnetic initialization unit 41 may be disposed on a movement path of a rail which moves in a horizontal direction. In this case, when the wafer 1, which is placed on the rail and moves in the horizontal direction, passes by a predetermined position, magnetic initialization is executed on the wafer 1. The magnetically initialized water 1 moves on the rail, and is automatically transferred from the magnetic initialization unit 41 to the annealing unit 42.

The annealing unit 42 has a function of executing anneal which imparts a temperature variation to the wafer 1 and applies a thermal load to the wafer 1. The thermal load, which is applied to the wafer 1 by the annealing unit 42, is set to be greater than at least the thermal load in the IR reflow soldering step. The annealing unit 42 shifts the annealed wafer 1 to the moving rail, and automatically transfers the wafer 1 to the function tester 43.

Here, the IR reflow soldering step is, for example, a step for soldering a packaged magnetic storage device 3 onto a printed circuit board. The IR reflow soldering step includes, for example, a preliminary heating process for uniformizing temperatures on the printed circuit board, and a main heating process for performing heating, following the preliminary heating process, at temperatures higher than the temperatures at the time of the preliminary heating process, and performing soldering. For example, the total time of the preliminary heating process, main heating process, and the heating and cooling periods for a transition to each heating process is about six minutes. In addition, the temperature of the magnetic storage device 3 in the main heating process is set in a range of, for example, 200° C. to 260° C., and is, for instance, about 255° C.

Figure 8:
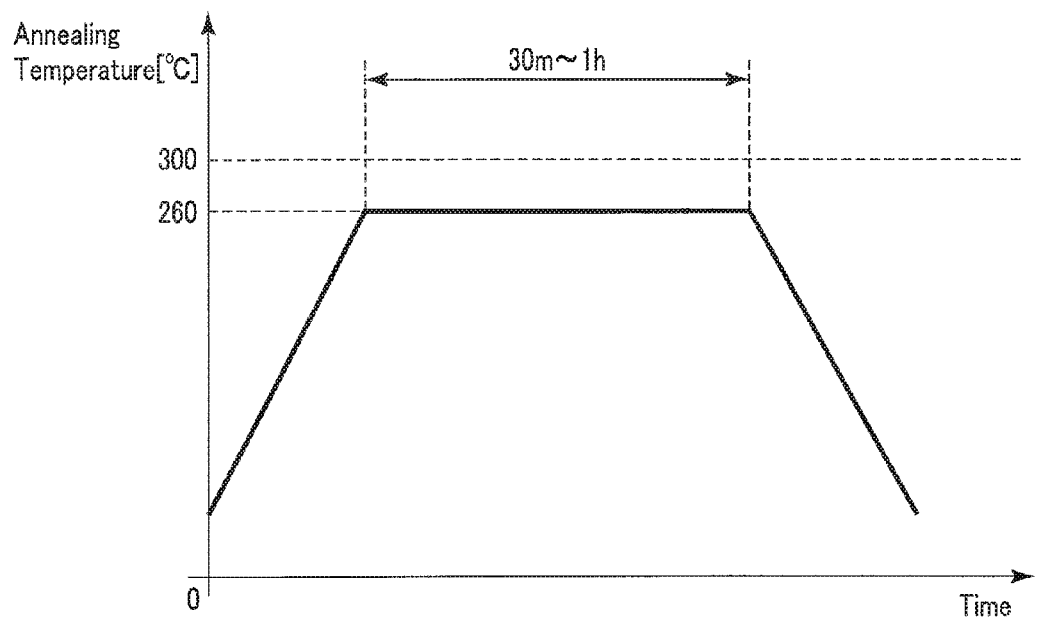
FIG. 8 is a schematic view illustrating a temperature profile of annealing by a heat treatment unit according to the first embodiment.

The annealing unit 42 can set a temperature profile which is greater than at least the above-described thermal load in the IR reflow soldering step. FIG. 8 is a schematic view illustrating an example of the temperature profile which the annealing unit 42 of the screening device 4 according to the first embodiment imparts to the wafer 1. The annealing unit 42 may set about 260° C. for the wafer 1 during a period of 30 minutes to one hour. Incidentally, the annealing unit 42 can set, aside from the above-described temperature profile, another temperature profile which is greater than the thermal load in the IR reflow soldering step. For example, in order to shorten the time that is needed for the annealing step, the annealing unit 42 may impart higher temperatures to the wafer 1. However, there is a possibility that the magnetic characteristic of the magnetoresistive effect element 27 deteriorates in a high-temperature environment. For example, the magnetic characteristic of the magnetoresistive effect element 27 deteriorates in a high-temperature environment of 300° C. or above. Accordingly, the temperature variation, which the annealing unit 42 imparts to the wafer 1, is set such that the temperature of the wafer 1 does not rise to 300° C. or above.

The function tester 43 includes a function of executing a function test on each memory cell 20 in the wafer 1. To be more specific, the function tester 43 includes a writing circuit 431, a reading circuit 432, and a determining circuit 433.

The writing circuit 431 successively accesses a plurality of input/output circuits 36 disposed in respective chips 2 in the wafer 1, and sends write signals for writing first data to all memory cells 20 in the wafer 1. The first data is data which is stored by setting the magnetization orientation of the storage layer 272 and the magnetization orientation of the reference layer 274 to be antiparallel to each other. Thus, the writing circuit 431 according to the present embodiment writes data "1" as the first data.

The reading circuit 432 successively accesses the plural input/output circuits 36 disposed in the respective chips 2 in the wafer 1, and sends read signals for reading data (second data) which is stored in the magnetoresistive effect elements 27. The reading circuit 432 receives from the respective input/output circuits 36 output signals indicative of second data which were read as results of the read signals, and reads all data in the wafer 1. The reading circuit 432 transfers the output signals, which were received from the respective input/output circuits 36, to the screening circuit 433.

The determining circuit 433 receives the output signals which were transferred from the reading circuit 432. Based on the output signals, the determining circuit 433 determines whether the read second data agrees with the first data (=data "1"), with respect to all magnetoresistive effect elements 27 in the wafer 1. The determining circuit 433 screens, as defective, the magnetoresistive effect elements 27 with respect to which the second data was determined to disagree with the first data, as the result of the determination. Specifically, the determining circuit 433 may include a function of setting the memory cell 20, which was determined to cause hard fail, to be unusable, or a function of setting the magnetic storage device 3, in which bad memory cells 20 exceed a predetermined threshold, to be unusable. In addition, the magnetic storage device 3 may have a function of replacing the defective memory cell 20 with a redundant memory cell 20. This function may be implemented in modifying the connection in the magnetic storage device 3. To be more specific, for example, the connection in the magnetic storage device 3 may be modified so as to perform access such as a write operation and read operation, to the redundant memory cell 20 when an instruction of access to the defective memory cell 20 is received. The portion of the magnetic storage device 3 to be modified, for example, includes one or more of the controller 37, the row decoder 34, the current sink 32, and the SA/WD 33. In addition, the determining circuit 433 may accumulate information, such as the number of occurrences of bad memory cells 20 and the manufacturing environment at a time of occurrence of hard fail, in a memory (not shown) for the purpose of feedback at a time of subsequent manufacture.

1.2. Re: Operation 1.2.1. Re: Testing Operation

Figure 9:
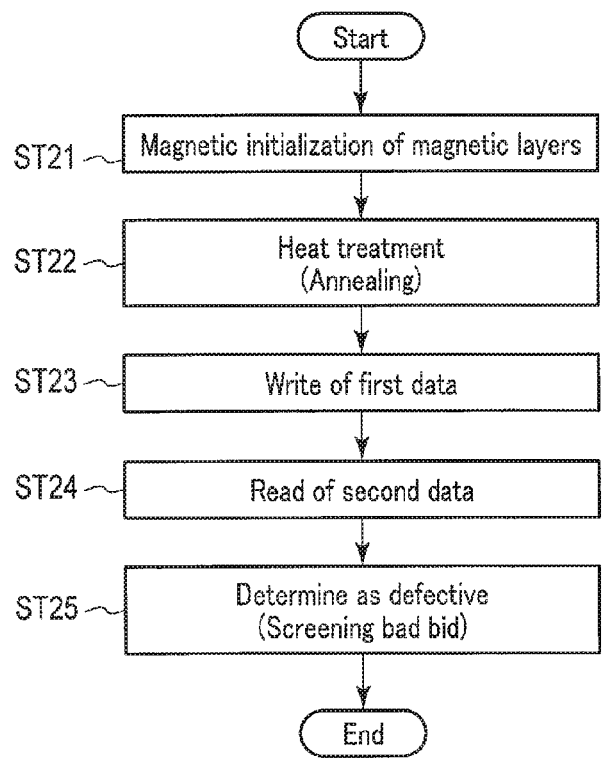
FIG. 9 is a flowchart illustrating the operation of the testing device according to the first embodiment.

Next, the operation of the testing device 4 according to the first embodiment is described with reference to a flowchart of FIG. 9.

In step ST21, the magnetic initialization unit 41 magnetically initializes all magnetoresistive effect elements 27 in the wafer 1. Specifically, the magnetic initialization unit 41 applies a magnetic field exceeding the coercivity Hc_SCL1 of the shift cancelling layer 276. Thereby, each of the magnetization orientations of the shift cancelling layer 276, reference layer 274 and storage layer 272 is magnetically initialized in a direction parallel to the direction of the magnetic field applied by the magnetic initialization unit 41. Next, the magnetic initialization unit 41 applies a magnetic field exceeding the coercivity Hc_RL1 of the reference layer 274, in a direction opposite to the coercivity Hc_SCL1 of the shift cancelling layer 276. Thereby, the magnetization orientations of the reference layer 274 and storage layer 272 are magnetically initialized in a direction which is antiparallel to the magnetization orientation of the shift cancelling layer 276. Since the the magnetization orientations of the reference layer 274 and storage layer 272 are magnetically initialized in the direction parallel to each other, all magnetoresistive effect elements 27 enter the state in which data "0" is set. In the meantime, the magnetic initialization unit 41 may further magnetically initialize, or may not further magnetically initialize, the storage layer 272 with data "1". The wafer 1, which was magnetically initialized by the magnetic initialization unit 41, moves on the rail and is sent to the annealing unit 42.

In step ST22, the annealing unit 42 performs annealing on the magnetically initialized wafer 1. The annealing unit 42 imparts, for example, a temperature variation of the profile as illustrated in FIG. 8, to the wafer 1. By this annealing, of the magnetoresistive effect elements 27 formed in the wafer 1, the individuals distributed in the left-end region 100 illustrated in FIG. 6 cause hard fail. The magnetoresistive effect elements 27, which caused hard fail, enter the state in which the magnetoresistive effect elements 27 are fixed with data "0". The wafer 1, which was annealed by the annealing unit 42, moves on the rail, and is conveyed to the function tester 43.

The function tester 43 executes a function test on the annealed wafer 1. Specifically, the function tester 43 executes the following steps ST23 to ST25.

In step ST23, the writing circuit 431 successively accesses the input/output circuits 36 of the respective chips 2 disposed on the wafer 1, and sends write signals for writing data "1" (first data) to all magnetoresistive effect elements 27. The write signal includes a write command of data "1" and an address of a write destination. Thereby, data "1" is written in all magnetoresistive effect elements 27 excluding the magnetoresistive effect elements 27 which caused hard fail. On the other hand, the data, which is retained by the magnetoresistive effect elements 27 that caused hard fail, remains "0".

In step ST24, the reading circuit 432 successively sends read signals of data "1" to the respective input/output circuits 36, to which the write signals of data "1" was sent. The reading circuit 432 receives output signals which were output from the respective input/output circuits 36 in accordance with the sent read signals, and sends the output signals to the determining circuit 433.

In step ST25, the determining circuit 433 determines, as defective, the magnetoresistive effect element 27 which caused hard fail. Specifically, based on the received output signals, the determining circuit 433 determines whether the second data, which was read from the magnetoresistive effect element 27 of each memory cell 20, is data "1" or not. The memory cell 20, in which the read second data was determined to agree with the first data as a result of the determination, is determined not to cause hard fail. On the other hand, the memory cell 20, in which the read second data was determined to disagree with the first data, is determined to cause hard fail, and is determined as defective.

By the above, the testing operation is completed.

1.2.2. Re: Write Operation

Next, an example of the write operation of the magnetic storage device 3 according to the first embodiment is described.

Upon receiving a write command, which instructs data write, from the writing circuit 431 of the function tester 43, the input/output circuit 36 transfers a write signal, which instructs data write, and an address of a write destination, to the controller 37. In addition, the input/output circuit 36 transmits data "1", which is be written, to the page buffer 35. Of the address of the write destination, the controller 37 transfers a row address to the row decoder 34, and transfers a column address to the SA/WD 33.

Based on the row address and column address, the row decoder 34 and SA/WD 33 select a write-target memory cell 20. Based on the write command, the SA/WD 33 writes the data, which is stored in the page buffer 35, to the selected memory cell 20.

By the above, the write operation is completed.

1.2.3. Re: Read Operation

Next, an example of the read operation of the magnetic storage device 3 according to the first embodiment is described.

Upon receiving a read command, which instructs data read, from the reading circuit 432 of the function tester 43, the input/output circuit 36 transfers a read signal, which instructs data read, and an address of a read source, to the controller 37. Of the address of the read source, the controller 37 transfers a row address to the row decoder 34, and transfers a column address to the SA/WD 33.

Based on the row address and column address, the row decoder 34 and SA/WD 33 select a read-target memory cell 20. Based on the read command, the SA/WD 33 transfers the data, which is stored in the selected memory cell 20, to the page buffer 35. The input/output circuit 36 transmits the read data, which is stored in the page buffer 35, to the reading circuit 432 of the function tester 43.

By the above, the read operation is completed.

1.3. Re: Manufacturing Method of Magnetic Storage Device

Figure 10:
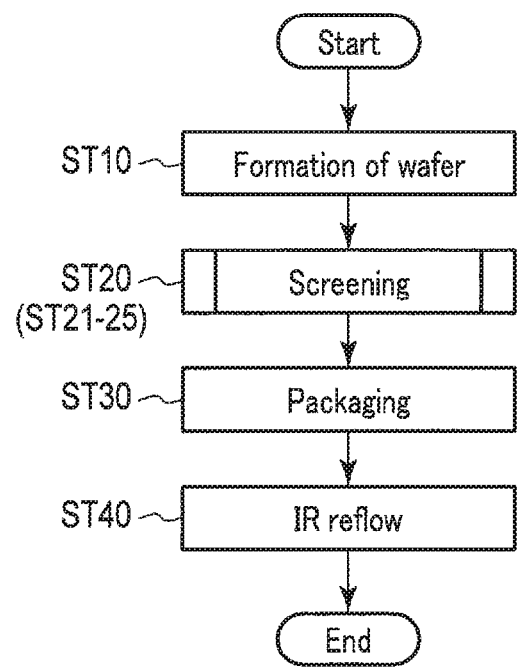
FIG. 10 is a flowchart illustrating manufacturing method of the storage device according to the first embodiment.

Next, manufacturing method of the magnetic storage device according to the first embodiment is described with reference to a flowchart of FIG. 10.

To start with, in step ST10, a wafer 1 is formed. Specifically, various kinds of semiconductor elements are formed on a semiconductor substrate 21 of the wafer 1. The various semiconductor elements constitute magnetic storage devices 3 including the magnetoresistive effect elements 27 in a plurality of chips 2 in the wafer 1. A passivation film (not shown) may be disposed above the magnetoresistive effect elements 27 in order to protect the magnetic storage devices 3. The passivation film is formed by some steps including heating step. The passivation film, for example, may consist of polyimide. An external terminal, which is accessible to an input/output circuit 36 formed in each chip 2, may be formed on the wafer 1.

In step ST20, a testing step is executed on the wafer 1. Specifically, steps ST21 to ST25 as illustrated in FIG. 9 are executed. Thereby, bad bits on the wafer 1 are screened. Incidentally, before and after this step ST20, other screening operations may also be executed. Such other screening operations include, for instance, a burn-in test.

Next, the screened wafer 1 is divided into units of chips 2 by a dicing step. In step ST30, each divided chip 2 is packaged.

In step ST40, each packaged magnetic storage device is soldered onto a printed circuit board by an IR reflow soldering step. In addition, other components, such as a chip of a processor, are soldered onto the printed circuit board. By assembling the thus obtained circuit board and other components, an electronic device is completed. In the meantime, by the testing step of step ST20, the magnetoresistive effect element 27, which may cause hard fail, was already screened. Accordingly, there occurs no magnetoresistive effect element which may newly cause hard fail by the IR reflow soldering step in step ST40.

1.4. Advantageous Effects of the Embodiment

In the magnetoresistive effect element, the magnetization orientations of the respective layers tend to easily change due to a temperature variation. For example, in the magnetoresistive effect element, the magnetization orientation of the reference layer or shift cancelling layer, which is to be fixed, may be reversed by annealing in the fabrication process of the magnetic storage device. Such unintended reversal of the magnetization orientation of the reference layer or shift cancelling layer causes a state in which retention of desired data is impossible.

By contrast, in the first embodiment, the above problem is solved by testing the magnetoresistive effect element in which unintended reversal of the magnetization orientation may occur due to annealing in the fabrication process.

According to the first embodiment, the testing method includes the magnetic initialization step of magnetically initializing the magnetoresistive effect element 27 functioning as the memory element including at least the storage layer 272 functioning as a first ferromagnetic layer, the reference layer 274 functioning as a second ferromagnetic layer, the shift cancelling layer 276 functioning as a third ferromagnetic layer, the first middle layer 273 functioning as a first nonmagnetic layer disposed between the storage layer 272 and the reference layer 274, and the second middle layer 275 functioning as a second nonmagnetic layer disposed between the reference layer 274 and the shift cancelling layer 276; the heat treatment step of annealing the magnetic storage device 3 functioning as a storage device including the magnetoresistive effect element 27; the writing step of writing, after the heat treatment step, first data which is retained by setting the magnetization orientation of the storage layer 272 and the magnetization orientation of the reference layer 274 to be antiparallel to each other; the reading step of reading, after the writing step, second data which is retained in the magnetoresistive effect element 27; and the determining step of determining the magnetoresistive effect element 27 as defective, when the first data and the second data disagree. Thereby, the magnetoresistive effect element 27, in which hard fail was caused by the heat treatment step, can be screened. If a supplementary description is given, the value of the first magnetization orientation reversing magnetic field Hc_ex01 varies among plural magnetoresistive effect elements 27. In the magnetoresistive effect elements 27 with a low value of the first magnetization orientation reversing magnetic field Hc_ex01, hard fail may be caused by the heat treatment step. In the magnetoresistive effect elements 27 in which hard fail was caused, since data "1" that is the first data cannot be written, the second data that is read after the write process does not agree with the first data. Accordingly, the magnetoresistive effect element, in which unintended reversal of the magnetization orientation may occur due to the annealing in the fabrication process, can be screened.

In addition, according to a first mode of the first embodiment, the magnetic initialization step is executed such that the magnetization orientation of the reference layer 274 and the magnetization orientation of the shift cancelling layer 276 become antiparallel to each other. Thereby, in the plural magnetoresistive effect elements 27 prior to the annealing, the influence of the leak magnetic field of the reference layer 274 upon the storage layer 272 is cancelled. On the other hand, the magnetoresistive effect element 27, in which hard fail was caused after the annealing, is strongly affected by the leak magnetic field of the reference layer 274 upon the storage layer 272. In this manner, only the magnetoresistive effect element 27, in which hard fail may be caused by the annealing, can be efficiently screened.

Furthermore, according to a second mode of the first embodiment, the thermal load on the magnetoresistive effect element 27 by the heat treatment step is set to be greater than at least the thermal load by the IR reflow soldering step. Thereby, the magnetoresistive effect element 27, in which hard fail may be caused by the IR reflow soldering step that is executed after the packaging, can be screened beforehand with high accuracy.

In addition, according to a third mode of the first embodiment, the above-described heat treatment step, writing step, reading step and screening step are executed on the plural magnetoresistive effect elements 27 formed on the same wafer 1. Thereby, the screening can be executed in the state of the wafer 1, without the screening being executed in the state of the chip 2. Therefore, the screening can be executed more efficiently.

2. Second Embodiment

Next, a description is given of testing method, manufacturing method, and a testing device of a storage device according to a second embodiment. The second embodiment is applied to a magnetic storage device including a magnetoresistive effect element 27 which may be stabilized in the state in which the magnetization orientations of the reference layer 274 and shift cancelling layer 276 are antiparallel, even if a difference in coercivity is not imparted between the reference layer 274 and shift cancelling layer 276 in the first embodiment. Only different points from the first embodiment will be described below.

2.1. Re: Configuration of Magnetoresistive Effect Element

Figure 11:
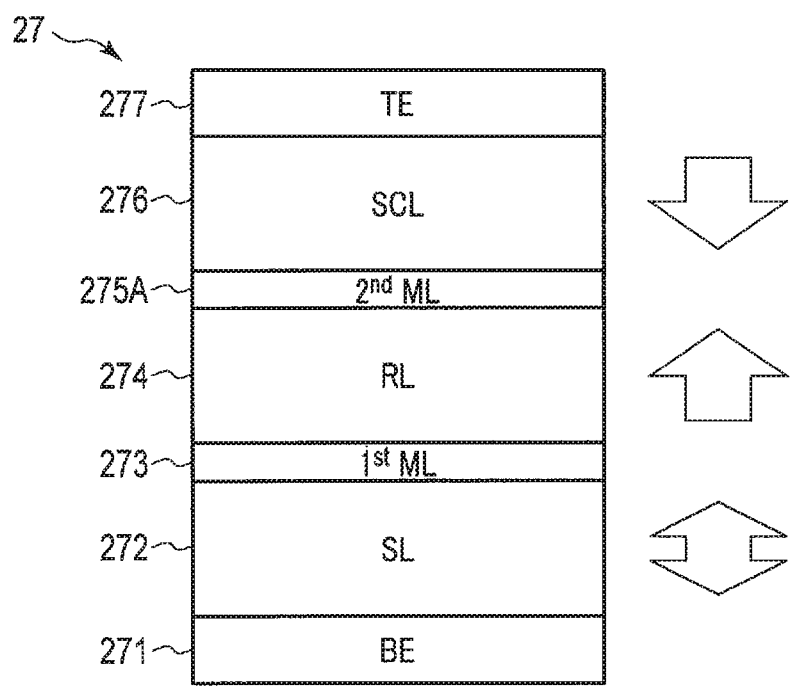
FIG. 11 is a schematic view illustrating the configuration of a magnetoresistive effect element according to a second embodiment.

To begin with, the configuration of the magnetoresistive effect element 27 according to the second embodiment is described. FIG. 11 is a schematic view illustrating the configuration of the magnetoresistive effect element 27 according to the second embodiment. The magnetoresistive effect element 27 according to the second embodiment differs from that of the first embodiment in that a second middle layer 275A is substituted for the second middle layer 275 in the first embodiment.

As illustrated in the Figure, the second middle layer 275A is provided in order to antiferromagnetically couple the reference layer 274 and shift cancelling layer 276. As the second middle layer 275A, a nonmagnetic metal, such as ruthenium (Ru), can be used. When ruthenium (Ru) is used for the second middle layer 275A, the coupling force for antiferromagnetically coupling the reference layer 274 and shift cancelling layer 276 can be increased by adjusting the film thickness of the second middle layer 275A. For example, the film thickness of the second middle layer 275A is adjusted in a range of about 0.5 nm to 1.0 nm. Thereby, the magnetization orientations of the reference layer 274 and shift cancelling layer 276 are automatically stabilized in the antiparallel state without executing magnetic initialization. This configuration of the magnetoresistive effect element 27 is called SAF (Synthetic Antiferromagnetic) configuration.

In the meantime, it should suffice if the magnetization orientations of the reference layer 274 and shift cancelling layer 276 are antiparallel to each other, and the orientation thereof is not limited to that illustrated in FIG. 11. For example, the magnetization orientation of the reference layer 274 may be a direction toward the storage layer 272, and the magnetization orientation of the shift cancelling layer 276 may be a direction toward the top electrode 277. In addition, the magnetoresistive effect elements 27 of the SAF configuration does not require magnetic initialization. Accordingly, the magnetization orientations of the magnetoresistive effect elements 27 according to the second embodiment do not need to be uniformized to be identical over the same wafer 1.

FIG. 12 is a schematic view illustrating an R-H characteristic of the magnetoresistive effect element 27 according to the second embodiment. In the meantime, in the R-H characteristic illustrated in FIG. 12, like the case of FIG. 4, it is assumed that the coercivity Hc_SCL (not shown) of the shift cancelling layer 276 is greater than the coercivity Hc_RL of the reference layer 274. In addition, in FIG. 12, a magnetic field of a magnitude exceeding the coercivity Hc_SCL is not depicted. Accordingly, in the range of the magnetic field illustrated in FIG. 12, it is assumed that the magnetization orientation of the shift cancelling layer 276 is fixed to be a direction of an arrow toward the reference layer 274.

As illustrated in the Figure, in an initial state (3a) in which the magnetic field is zero, it is assumed that the magnetization orientations of the reference layer 274 and shift cancelling layer 276 are antiparallel, and the magnetization orientations of the reference layer 274 and storage layer 272 are parallel. At this time, the magnetoresistive effect element 27 is in the low resistance state. If a magnetic field in a direction from the shift cancelling layer 276 toward the storage layer 272 is applied from this state, the magnetization orientation of the storage layer 272 is reversed at a magnetic field Hc_SL1. Accordingly, the magnetization orientations of the storage layer 272 and reference layer 274 become antiparallel, and the magnetoresistive effect element 27 enters a high resistance state (3b). If the applied magnetic field is further increased, the magnetization orientation of the reference layer 274 is reversed at a magnetic field Hc_RL1, and the magnetization orientations of the reference layer 274 and shift cancelling layer 276 become parallel. At this time, by being affected by the leak magnetic field of the reference layer 274 and shift cancelling layer 276, the magnetization orientation of the storage layer 272 is fixed in the parallel state to the magnetization orientations of the reference layer 274 and shift cancelling layer 276 (3c). Specifically, the magnetoresistive effect element 27 is fixed in the low resistance state, and enters the state in which hard fail was caused.

The applied magnetic field is weakened from the state (3c=4a) in which hard fail was caused. Then, at a magnetic field Hc_RL2 before the magnetic field becomes zero, the magnetization orientation of the reference layer 274 is reversed, and the magnetoresistive effect element 27 enters the high resistance state. This state continues also in the state (4b) in which the magnetic field is zero. Specifically, in the state (4b), the magnetization orientation of the reference layer 274 remains antiparallel to the shift cancelling layer 276 and storage layer 272. In short, in the magnetoresistive effect element 27 in the state (4b), hard fail is eliminated. If the magnetic field in the opposite direction is further applied, the magnetization orientation of the storage layer 272 is reversed at a magnetic field Hc_SL2, and the magnetoresistive effect element 27 enters a low resistance state (4c). Here, all magnetization orientations of the reference layer 274 and shift cancelling layer 276 restore to the same magnetization orientations as in the initial state (3a).

In this manner, in the magnetoresistive effect element 27 according to the second embodiment, the direction of the sign of the second magnetization orientation reversing magnetic field Hc_ex02 is different from that in the first embodiment. Specifically, when the direction of the magnetic field, which is applied from the initial state (1a) to the hard fail state (1c), is "positive", the second magnetization orientation reversing magnetic field Hc_ex02 in the first embodiment becomes "negative". On the other hand, the second magnetization orientation reversing magnetic field Hc_ex02 in the second embodiment becomes "positive". Accordingly, the magnetoresistive effect element 27 of the SAF configuration has such a characteristic that even if hard fail is caused by applying a magnetic field, the hard fail is eliminated by restoring the magnetic field to zero.

In the meantime, when the magnetoresistive effect element 27 of the SAF configuration is manufactured, the values of the second magnetization orientation reversing magnetic field Hc_ex02 are distributed in the neighborhood of the design value. FIG. 13 is a histogram illustrating a distribution of second magnetization orientation reversing magnetic fields Hc_ex02 in a case where a plurality of magnetoresistive effect elements 27 according to the second embodiment were manufactured. As illustrated in the Figure, when the magnetoresistive effect elements 27 according to the second embodiment were manufactured, individual differences occur among the values of the second magnetization orientation reversing magnetic field Hc_ex02, and these values are distributed in a range centering on a design value Hc_ex02_$m$ (>0). Here, the second magnetization orientation reversing magnetic field Hc_ex02 of magnetoresistive effect elements 27, which are distributed in a left-end region 100A of the histogram shown in FIG. 13, becomes the value (Hc_ex02<0) in the direction opposite to the design value Hc_ex02_$m$. The magnetoresistive effect elements 27, which are distributed in the left-end region 100A, have a weak antiferromagnetic coupling force by the second middle layer 275A, or have no antiferromagnetic coupling force. Accordingly, the magnetoresistive effect elements 27, which are distributed in the left-end region 100A, may cause hard fail.

Figures 14, 15:
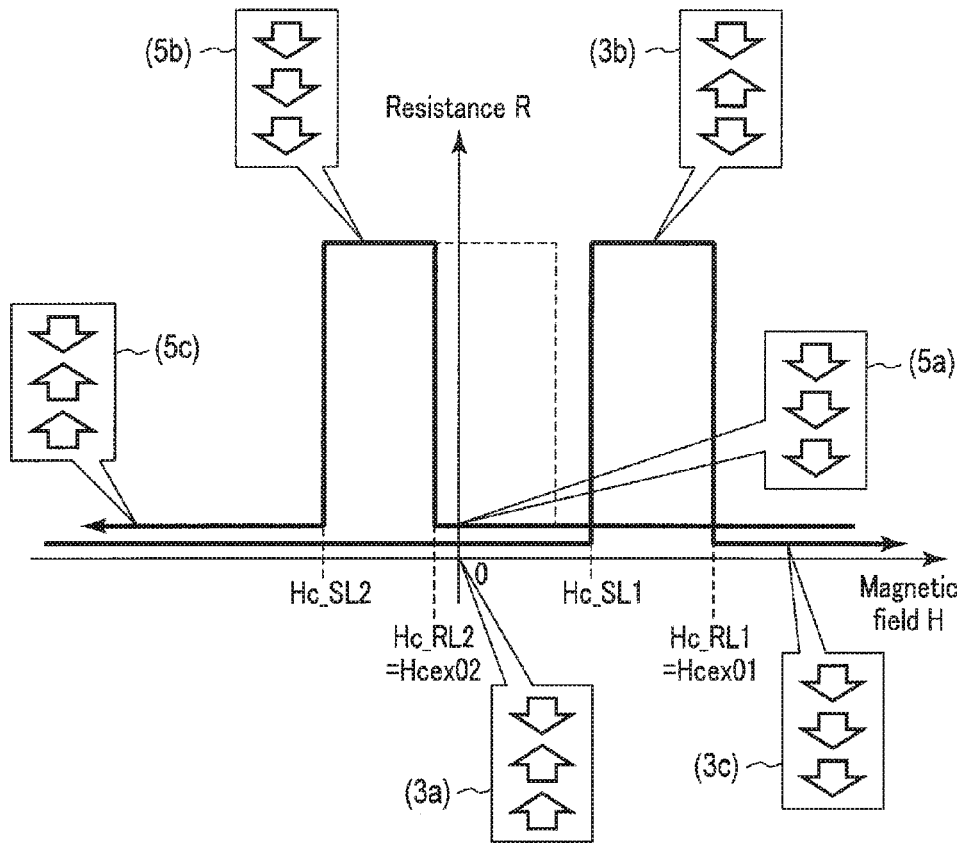
FIG. 14 is a schematic view illustrating the R-H characteristic of the magnetoresistive effect element according to the second embodiment.
FIG. 15 is a diagram illustrating a mode in which the magnetoresistive effect element according to the second embodiment causes hard fail.

FIG. 14 is a schematic view illustrating the R-H characteristic of the magnetoresistive effect element 27 according to the second embodiment. The magnetoresistive effect elements 27 having the R-H characteristic illustrated in FIG. 14 are individuals distributed in the left-end region 100A of the histogram shown in FIG. 13.

As illustrated in the Figure, the R-H characteristic from the initial state (3$a$) to the state (3$c$) in which hard fail is caused is substantially the same as the R-H characteristic illustrated in FIG. 12. The applied magnetic field is weakened from the state (3$c$) in which hard fail is caused. In a state (5$a$) in which the applied magnetic field has become zero, the magnetization orientation of the reference layer 274 is still in the parallel state to the magnetization orientation of the shift cancelling layer 276. If the magnetic field applied in the opposite direction is further increased, the magnetization orientation of the reference layer 274 is reversed at a magnetic field Hc_RL2 (=Hc_ex02<0), and the magnetoresistive effect element 27 enters the high resistance state (5$b$). If the magnetic field applied in the opposite direction is further increased, the magnetization orientation of the storage layer 272 is reversed at a magnetic field Hc_SL2, and the magnetoresistive effect element 27 enters the low resistance state (5$c$). Here, all magnetization orientations of the storage layer 272, reference layer 274 and shift cancelling layer 276 restore to the same magnetization orientations as in the initial state (3$a$).

In this manner, in the magnetoresistive effect elements 27 distributed in the left-end region 100A, when hard fail was caused by the change of the magnetic field, the hard fail is not eliminated even if the magnetic field is restored to zero. Accordingly, of the magnetoresistive effect elements 27 of the SAF configuration, the individuals distributed in the left-end region 100A are discriminated as the mode in which hard fail is caused.

FIG. 15 is a diagram illustrating a mode in which the magnetoresistive effect element 27 according to the second embodiment causes hard fail. As illustrated in the Figure, when the second magnetization orientation reversing magnetic field Hc_ex02 is negative, the magnetoresistive effect element 27 may cause hard fail. As described above, the magnetization orientation in the initial state of the magnetoresistive effect element 27 of the SAF configuration may take two orientations. In each case, hard fail is caused by the reversal of the magnetization orientation of either the reference layer 274 or the shift cancelling layer 276. Accordingly, there are two magnetization orientations of the magnetoresistive effect element 27 in the hard fail state. However, in either case, the magnetization orientations of the storage layer 272, reference layer 274 and shift cancelling layer 276 are all in the parallel state.

In the meantime, the hard fail, which is caused by the magnetoresistive effect element 27 in which the second magnetization orientation reversing magnetic field Hc_ex02 becomes negative, may also occur due to an external environment, other than the applied magnetic field. For example, like the first embodiment, a temperature variation, in particular, a high-temperature environment, may reverse the magnetization orientation of the magnetoresistive effect element 27. Specifically, in the magnetoresistive effect element 27 according to the second embodiment, when the second magnetization orientation reversing magnetic field Hc_ex02 is negative, hard fail tends to easily occur due to the temperature variation.

2.2. Re: Configuration of Testing Device

Next, the configuration of the entirety of a testing device of the magnetic storage device according to the second embodiment is described. The testing device of the magnetic storage device according to the second embodiment is a device which is operable on a wafer in which magnetoresistive effect elements of SAF configuration are formed. FIG. 16 is a block diagram illustrating the configuration of the testing device according to the second embodiment. As illustrated in the Figure, the functional configuration of a testing device 4A is the same as that of the testing device 4 according to the first embodiment, except that the testing device 4A includes the annealing unit 42 and function tester 43, but does not include the magnetic initialization unit 41.

2.3. Re: Testing Operation

Figure 17:
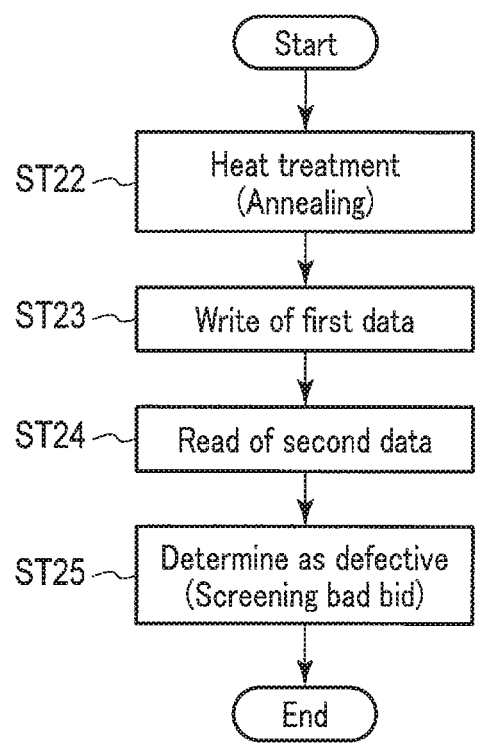
FIG. 17 is a flowchart illustrating the operation of the testing device according to the second embodiment.

Next, the operation of the testing device according to the second embodiment is described with reference to a flowchart of FIG. 17.

In step ST22, the annealing unit 42 performs annealing on the wafer 1 in which the magnetic storage device 3 including the magnetoresistive effect element 27 of the SAF configuration is formed. The annealing unit 42 imparts, for example, a temperature variation of the temperature profile as illustrated in FIG. 8, to the wafer 1. The wafer 1, which was annealed by the annealing unit 42, moves on the rail, and is conveyed to the function tester 43.

The function tester 43 executes a function test on the annealed wafer 1. Specifically, the function tester 43 executes the following steps ST23 to ST25. Incidentally, since steps ST23 to ST25 are the same as in the first embodiment, a description thereof is omitted here.

By the above, the testing operation is completed.

2.4. Advantageous Effects of the Embodiment

According to the second embodiment, the magnetic initialization step in the first embodiment is omitted. Thereby, while the number of steps necessary for testing is reduced, the magnetoresistive effect element, in which unintended reversal of the magnetization orientation may occur due to heat treatment in the fabrication process, can be screened.

In addition, according to a first mode of the second embodiment, the above-described reference layer 274 and shift cancelling layer 276 are antiferromagnetically coupled by the second middle layer 275. Thereby, the reference layer 274 and shift cancelling layer 276 can automatically have magnetization orientations which are antiparallel to each other when the layers are formed, without executing magnetic initialization.

Furthermore, according to the second embodiment, the same advantageous effects as in the first to third modes of the first embodiment can be obtained.

3. Other Embodiments

In each of the above-described embodiments, the description was given of the example in which a bad bit is screened in the state of the wafer 1. However, the embodiments are not limited to this example. For example, a bad bit may be screened in the state of the chip 2.

In each of the above-described embodiments, the case was described in which the magnetoresistive effect element is a vertical magnetization MTJ. However, the embodiments are not limited to this case. The magnetoresistive effect element may be a horizontal magnetization MTJ element having a horizontal magnetic anisotropy. In addition, in each of the embodiments, the case was described in which the magnetoresistive effect element is a bottom free type (top pin type) MTJ element in which the memory layer is disposed below the reference layer. However, the embodiments are not limited to this case. The magnetoresistive effect element may be a top free type (bottom pin type) MTJ element in which the memory layer is disposed above the reference layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A testing method of a memory device, comprising:
   annealing the memory device, the memory device including a memory element, the memory element including a first ferromagnetic layer, a second ferromagnetic layer, a third ferromagnetic layer, a first nonmagnetic layer, and a second nonmagnetic layer, the first nonmagnetic layer being disposed between the first ferromagnetic layer and the second ferromagnetic layer, and the second nonmagnetic layer being disposed between the second ferromagnetic layer and the third ferromagnetic layer;
   performing, after the annealing, to the memory element a process which sets a first magnetization orientation of the first ferromagnetic layer to be antiparallel to a second magnetization orientation of the second ferromagnetic layer;
   reading, after the performing of the process which sets the first magnetization orientation to be antiparallel to the second magnetization orientation, data from the memory element; and
   determining the memory element as defective due to the second magnetization orientation being parallel to a third magnetization orientation of the third ferromagnetic layer, when data represented by the first magnetization orientation being antiparallel to the second magnetization orientation differs from the read data.

2. The method of claim 1, wherein a thermal load on the memory element by the annealing is greater than a thermal load by a reflow soldering.

3. The method of claim 1, wherein the annealing is performed after forming a passivation layer above the memory element, and wherein the annealing, the performing of the process which sets the first magnetization orientation to be antiparallel to the second magnetization orientation, the reading, and the determining are performed before a reflow soldering to the memory device.

4. The method of claim 1, further comprising magnetizing the second magnetization orientation to be antiparallel to the third magnetization orientation,
   wherein the annealing includes annealing the memory device including the memory element which was magnetized by the magnetizing.

5. The method of claim 1, wherein the second ferromagnetic layer and the third ferromagnetic layer are antiferromagnetically coupled by the second nonmagnetic layer.

6. The method of claim 1, wherein the annealing, the performing of the process which sets the first magnetization orientation to be antiparallel to the second magnetization orientation, the reading, and the determining are executed on a plurality of the memory elements formed on an identical wafer.

7. A testing device of a memory device, comprising an annealing unit, and a function tester including a writing circuit, a reading circuit and a determining circuit,
   wherein the annealing unit is configured to anneal the memory device including a memory element, the memory element including a first ferromagnetic layer, a second ferromagnetic layer, a third ferromagnetic layer, a first nonmagnetic layer, and a second nonmagnetic layer, the first nonmagnetic layer being disposed between the first ferromagnetic layer and the second ferromagnetic layer, and the second nonmagnetic layer being disposed between the second ferromagnetic layer and the third ferromagnetic layer;
   the writing circuit is configured to perform, after a process of the annealing, to the memory element a process which sets a first magnetization orientation of the first ferromagnetic layer to be antiparallel to a second magnetization orientation of the second ferromagnetic layer;
   the reading circuit is configured to read, after the process of the performing which sets the first magnetization orientation to be antiparallel to the second magnetization orientation, data from the memory element; and
   the determining circuit is configured to determine the memory element as defective due to the second magnetization orientation being parallel to a third magnetization orientation of the third ferromagnetic layer, when data represented by the first magnetization orientation being antiparallel to the second magnetization orientation differs from the read data.

8. The device of claim 7, wherein the annealing unit is configured to be capable of executing annealing with a thermal load which is greater than a thermal load by a reflow soldering.

9. The device of claim 7, wherein the annealing unit is configured to anneal the memory device after a passivation layer is formed above the memory element, and wherein the annealing unit, the writing circuit, the reading circuit, and the determining circuit are configured to execute each process before a reflow soldering to the memory device.

10. The device of claim 7, further comprising a magnetic initialization unit configured to magnetize the second magnetization orientation to be antiparallel to the third magnetization orientation, wherein the annealing unit is configured to anneal the memory device including the memory element which was magnetized by the magnetic initialization unit.

11. The device of claim 7, wherein the annealing unit is configured to anneal the memory element in which the second ferromagnetic layer and the third ferromagnetic layer are antiferromagnetically coupled by the second nonmagnetic layer.

12. The device of claim 7, wherein the annealing unit and the function tester are configured to execute, on a plurality of the memory elements formed on an identical wafer, the process of the annealing, the process of the performing which sets the first magnetization orientation to be antiparallel to the second magnetization orientation, a process of the reading, and a process of the determining.

13. A manufacturing method of a memory device, comprising:
    forming a memory element, the memory element including a first ferromagnetic layer, a second ferromagnetic layer, a third ferromagnetic layer, a first nonmagnetic layer, and a second nonmagnetic layer, the first nonmagnetic layer being disposed between the first ferromagnetic layer and the second ferromagnetic layer, and the second nonmagnetic layer being disposed between the second ferromagnetic layer and the third ferromagnetic layer;
    annealing the memory device including the formed memory element;
    performing, after the annealing, to the memory element a process which sets a first magnetization orientation of the first ferromagnetic layer to be antiparallel to a second magnetization orientation of the second ferromagnetic layer;
    reading, after the performing of the process which sets the first magnetization orientation to be antiparallel to the second magnetization orientation, data from the memory element; and
    determining the memory element as defective due to the second magnetization orientation being parallel to a third magnetization orientation of the third ferromagnetic layer, when data represented by the first magnetization orientation being antiparallel to the second magnetization orientation differs from the read data.

14. The method of claim 13, wherein a thermal load on the memory element by the annealing is greater than a thermal load by a reflow soldering.

15. The method of claim 13, wherein the producing includes forming a passivation layer above the memory element, and wherein the forming, the annealing, the performing the process which sets the first magnetization orientation to be antiparallel to the second magnetization orientation, the reading, and the determining are performed before a reflow soldering to the memory device.

16. The method of claim 13, further comprising magnetizing the second magnetization orientation to be antiparallel to the third magnetization orientation,
    wherein the annealing includes annealing the memory device including the memory element which was magnetized by the magnetizing.

17. The method of claim 13, wherein the second ferromagnetic layer and the third ferromagnetic layer are antiferromagnetically coupled by the second nonmagnetic layer.

18. The method of claim 13, wherein the forming, the annealing, the performing of the process which sets the first magnetization orientation to be antiparallel to the second magnetization orientation, the reading, and the determining are executed on a plurality of the memory elements formed on an identical wafer.

19. The method of claim 13, further comprising avoiding to use the memory element which was determined as defective.

* * * * *